(12) United States Patent
Shintani et al.

(10) Patent No.: US 9,177,640 B2
(45) Date of Patent: Nov. 3, 2015

(54) MULTI-LEVEL RECORDING IN A SUPERLATTICE PHASE CHANGE MEMORY CELL

(71) Applicant: National Institute of Advanced Industrial Science and Technology, Tokyo (JP)

(72) Inventors: Toshimichi Shintani, Ibaraki (JP); Susumu Soeya, Ibaraki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/163,160

(22) Filed: Jan. 24, 2014

(65) Prior Publication Data

US 2014/0376307 A1    Dec. 25, 2014

(30) Foreign Application Priority Data

Jun. 20, 2013    (JP) .................................. 2013-129466

(51) Int. Cl.
*G11C 13/00* (2006.01)
*G11C 11/56* (2006.01)
*H01L 45/00* (2006.01)

(52) U.S. Cl.
CPC ........ *G11C 13/0004* (2013.01); *G11C 11/5678* (2013.01); *G11C 13/0069* (2013.01); *H01L 45/06* (2013.01); *H01L 45/144* (2013.01)

(58) Field of Classification Search
CPC ..................................................... H01L 45/00
USPC .................. 365/148, 163, 165, 185.17; 257/2
See application file for complete search history.

(56) References Cited

U.S. PATENT DOCUMENTS

| 8,077,496 B2 * | 12/2011 | Choi .............................. 365/148 |
| 2006/0126381 A1 * | 6/2006 | Khouri et al. ................. 365/163 |
| 2010/0020593 A1 * | 1/2010 | Suh .............................. 365/163 |

(Continued)

FOREIGN PATENT DOCUMENTS

JP    2009-59902 A    3/2009

OTHER PUBLICATIONS

"Prototype of Phase-Change Channel Transistor for both Nonvolatile Memory and Current Control", Hosaka et al., IEEE Transactions on Electron Devices, 2007, 54, 517-523.*

(Continued)

*Primary Examiner* — Son Mai
*Assistant Examiner* — Muna A Techane
(74) *Attorney, Agent, or Firm* — McCormick, Paulding & Huber

(57) ABSTRACT

A phase-change device capable of realizing a multi-level record in a superlattice phase-change memory cell in which a superlattice phase-change material is used as a recording film, and thereby achieving the reduction in power consumption and the capacity increase is provided. To a phase-change memory cell composed of $GeTe/Sb_2Te_3$ superlattice or $SnTe/Sb_2Te_3$ superlattice, a SET pulse is once applied to form a SET state (low resistance state). Thereafter, recording pulses having respectively different voltage values between a voltage value forming the SET state and a voltage value forming a RESET state (high resistance state) are respectively applied to the superlattice phase-change memory cell twice or more. In this manner, a read resistance (SET resistance) corresponding to a recording pulse (SET pulse) and read resistances corresponding to each of the recording pulses are obtained, so that the multi-level record can be realized.

5 Claims, 7 Drawing Sheets

(56) References Cited

U.S. PATENT DOCUMENTS

| | | | |
|---|---|---|---|
| 2010/0165725 A1* | 7/2010 | Bedeschi | 365/163 |
| 2010/0200828 A1* | 8/2010 | Tominaga et al. | 257/2 |
| 2011/0103139 A1* | 5/2011 | Kau et al. | 365/163 |

OTHER PUBLICATIONS

"Interfacial Phase-Change memory", R.E Simpson, Nature Nanotechnology, Jul. 3, 2011, 501-505.*

Article entitled "Interfacial phase-change memory" by R. E. Simpson et al., Nature nanotechnology, published online Jul. 3, 2011; pp. 501-505.

Article entitled Low-Power Switching in Phase Change Memory using SnTe/Sb2Te3 Superlattice Flim, by S. Soeya et al., Proceedings of European Phase Change and Ovonic Symposium 2012, PC-08 (2012); pp. 154-155.

* cited by examiner

MULTI-LEVEL RECORDING IN A SUPERLATTICE PHASE CHANGE MEMORY CELL

CROSS-REFERENCE TO RELATED APPLICATION

The present application claims priority from Japanese Patent Application No. 2013-129466 filed on Jun. 20, 2013, the content of which is hereby incorporated by reference into this application.

TECHNICAL FIELD OF THE INVENTION

The present invention relates to a phase-change device.

BACKGROUND OF THE INVENTION

A phase-change device using a memory cell which records data by reversibly changing the state of a recording film between an amorphous state and a crystalline state has been known.

As a background art of the technical field of the present invention, there is Japanese Patent Application Laid-Open Publication No. 2009-59902 (Patent Document 1). In this patent publication, a solid-state memory cell in which a thin film containing Ge (germanium) and a thin film containing Sb (antimony) are formed to have a superlattice structure is described.

Moreover, R. E. Simpson et al., Nature Nanotechnology, 6, 501-505 (2011) (Non-Patent Document 1) describes a phase-change memory cell in which a superlattice phase-change material formed by alternately stacking GeTe (germanium-tellurium) and $Sb_2Te_3$ (antimony-tellurium) is used as a recording film.

Furthermore, S. Soeya et al., Proceedings of European Phase Change and Ovonic Symposium 2012, PC-08 (2012) (Non-Patent Document 2) describes a phase-change memory cell in which a superlattice phase-change material formed by alternately stacking SnTe (tin-tellurium) and $Sb_2Te_3$ (antimony-tellurium) is used as a recording film.

SUMMARY OF THE INVENTION

In the phase-change device, in order to avoid a heat disturbance, adoption of a superlattice phase-change material as a recording film has been studied. However, in the case of a superlattice phase-change memory cell using the superlattice phase-change material as a recording film, a multi-level record is difficult and data capacity increase cannot be achieved.

Therefore, an object of the present invention is to provide a phase-change device capable of the multi-level record in a superlattice phase-change memory cell using a superlattice phase-change material as a recording film, and thereby achieving the reduction in power consumption and the capacity increase.

In order to achieve the above-mentioned object, in the present invention, after a superlattice phase-change memory cell is brought into a SET state, a recording pulse having a voltage value between a voltage value for forming the SET state and a voltage value for forming a RESET state is applied to the superlattice phase-change memory cell twice or more, and thereby achieving a multi-level record in the phase-change device.

The effects obtained by a typical embodiment of the invention disclosed in this application will be briefly described below.

According to the present invention, it is possible to provide a phase-change device capable of the multi-level record in a superlattice phase-change memory cell using a superlattice phase-change material as a recording film, and thereby achieving the reduction in power consumption and the capacity increase.

Objects, configurations and effects other than those described above will become apparent from the following descriptions of the preferred embodiments.

BRIEF DESCRIPTIONS OF THE DRAWINGS

DESCRIPTIONS OF THE PREFERRED EMBODIMENTS

Figure 1A:
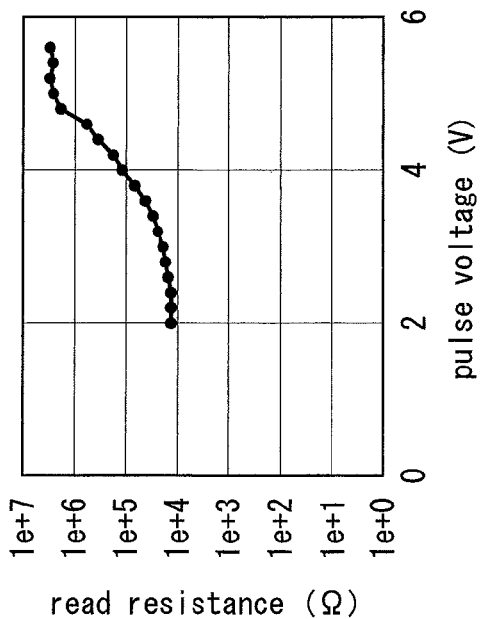
FIG. 1A is a graph showing SET characteristics of a device using GeSbTe.
Figure 1B:
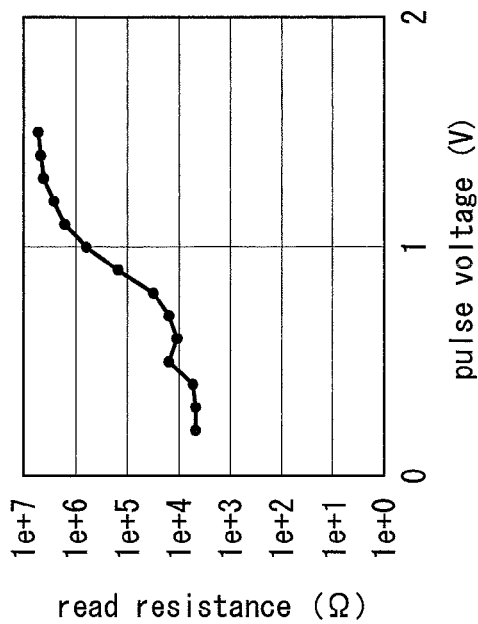
FIG. 1B is a graph showing RESET characteristics of the device using GeSbTe.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements} is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Also, even when mentioning that constituent elements or the like are "made of A", "made up of A", "provided with A" or "includes A" in the embodiments below, elements other than A are of course not excluded except the case where it is particularly specified that A is the only element thereof. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, in some drawings used in the following embodiments, hatching is used even in a plan view so as to make the drawings easy to see. Further, components having the same function are denoted by the same reference symbols throughout the drawings for describing the embodiments, and the repetitive description thereof will be omitted. Hereinafter, embodiments of the present invention will be described with reference to the drawings.

(First Embodiment)
<Description of Prior Art Technique>

In a "phase-change memory cell" using a phase-change material as a recording material, data is recorded by utilizing Joule heat generated by applying a voltage pulse to the recording material to cause an electric current to flow through the recording material.

In the case where the recording material is in a crystalline state, by melting the recording material by Joule heat and then quickly cooling the recording material, an amorphous state is produced. Moreover, in the case where the recording material is in an amorphous state, by applying a voltage pulse equal to or higher than a threshold voltage inherent to the recording material to utilize Joule heat generated by an electric current that is caused to flow through the recording material and gradually cooling the recording material by controlling the conditions of the voltage pulse, a crystalline state is produced.

GeSbTe (germanium-antimony-tellurium) is mainly used as the phase-change material, and the composition of $Ge_2Sb_2Te_5$ is used as a typical recording material. The composition of $Ge_2Sb_2Te_5$ can obtain good recording characteristics in a stoichiometric composition of GeTe and $Sb_2Te_3$, and $Ge_2Sb_2Te_5$ can be written as $(GeTe)_2(Sb_2Te_3)_1$. Since crystal resistivity and amorphous resistivity are different from each other by 3 to 6 orders of magnitude in GeSbTe, it is possible to record data.

In the following description, the low resistance state in which the recording material is in a crystalline state is referred to as "SET state", and the high resistance state in which the recording material is in an amorphous state is referred to as "RESET state".

In the above-mentioned GeSbTe, in order to achieve data capacity increase, a multi-level record has been proposed. The multi-level record in a phase-change memory cell is realized by adjusting the volume of an amorphous region. The volume of the amorphous region is dependent on the voltage value of a voltage pulse. Moreover, the read resistance to be finally formed is dependent on the volume of the amorphous region. Therefore, by controlling the voltage value and pulse width of a voltage pulse, the read resistance can be multi-leveled.

In the phase-change memory cell, however, GeSbTe needs to be molten in order to form the amorphous state as described above. Since the melting point of GeSbTe is typically about 630° C., a large power is required for raising the temperature to that temperature by using Joule heat. Moreover, since the heat generated at this time is transferred to the adjacent phase-change memory cell, if the adjacent phase-change memory cell is in the amorphous state, its GeSbTe is crystallized by the heat in some cases. This phenomenon is referred to as heat disturbance. The heat disturbance occurs remarkably, in particular, when the cell density is increased so as to increase the capacity.

In order to solve this problem, a "superlattice phase-change memory cell" in which a superlattice phase-change material is used as a recording material has been proposed (for example, Non-Patent Document 1). The superlattice phase-change material is formed by alternately stacking GeTe and $Sb_2Te_3$, and SET-RESET operations can be carried out by the power of about one-tenth of that for GeSbTe. Hereinafter, the superlattice phase-change material in which GeTe and $Sb_2Te_3$ are alternately stacked is referred to as GeTe/$Sb_2Te_3$ superlattice or GeTe-based superlattice.

The reason why the low power operation is possible in the GeTe/$Sb_2Te_3$ superlattice is that atoms moved by voltage pulses are only Ge and Te atoms. More specifically, only Ge and Te located at the interface between GeTe and $Sb_2Te_3$ are moved, so that the electric resistance is consequently changed by almost 3 orders of magnitude. In contrast to the above-mentioned GeSbTe in which all the atoms are moved, since only Ge and Te atoms are moved in the GeTe/$Sb_2Te_3$ superlattice, the power consumption can be reduced.

Moreover, as a material which can be used instead of the GeTe/$Sb_2Te_3$ superlattice, a superlattice phase-change material in which SnTe and $Sb_2Te_3$ are alternately stacked, that is, SnTe/$Sb_2Te_3$ superlattice has been proposed (for example, Non-Patent Document 2). In the case of the SnTe/$Sb_2Te_3$ superlattice, SET-RESET operations can be carried out by the power of about one-fifteenth of that for GeSbTe.

However, in the superlattice phase-change memory cell using the superlattice phase-change material as a recording material, it is difficult to carry out a multi-level record.

FIG. 1 shows SET characteristics and RESET characteristics of a device using the SnTe/$Sb_2Te_3$ superlattice. For use in comparison, SET characteristics and RESET characteristics of a device using GeSbTe are also shown in FIG. 1. FIGS. 1A and 1B are graphs respectively showing the SET characteristics and the RESET characteristics of the device using GeSbTe, and FIGS. 1C and 1D are graphs respectively showing the SET characteristics and the RESET characteristics of the device using the SnTe/$Sb_2Te_3$ superlattice.

The horizontal axis of each of FIGS. 1A, 1B, 1C and 1D represents the voltage value of a voltage pulse (pulse voltage), and the vertical axis of each of FIGS. 1A, 1B, 1C and 1D represents a read resistance that is measured, after applying a voltage pulse, by applying a read-out pulse (for example, 0.1 V) having a voltage value lower than that of the voltage pulse.

As shown in FIG. 1, the SET characteristics of the device using the SnTe/$Sb_2Te_3$ superlattice exhibit an abrupt change in read resistance in comparison with the SET characteristics of the device using GeSbTe. Similarly, the RESET characteristics of the device using the SnTe/$Sb_2Te_3$ superlattice exhibit an abrupt change in read resistance in comparison with the RESET characteristics of the device using the GeSbTe.

In the device using the SnTe/Sb$_2$Te$_3$ superlattice having these SET characteristics and RESET characteristics, it is difficult to control the read resistance between the read resistance in the SET state and the read resistance in the RESET state by using a voltage pulse.

For example, the case of realizing a multi-level record by a voltage pulse in a device using the SnTe/Sb$_2$Te$_3$ superlattice will be considered. In this case, the read resistance between the read resistance in the SET state and the read resistance in the RESET state is strongly dependent on the state of the device using the SnTe/Sb$_2$Te$_3$ superlattice and the state of the voltage pulse. For this reason, the read resistance between the read resistance in the SET state and the read resistance in the RESET state fluctuates greatly, and a possibility of failing to obtain a desired read resistance is increased.

It is possible to carry out the verify for the device using the SnTe/Sb$_2$Te$_3$ superlattice. The verify refers to an operation in which the read resistance is read out immediately after recording from the RESET state to the SET state or immediately after recording from the SET state to the RESET state, and in the case where the read resistance is not a desired read resistance, the recording is repeated until the desired resistance is obtained.

However, in the case of the device using the SnTe/Sb$_2$Te$_3$ superlattice, the number of verify times is increased. When the number of verify times is increased, the recording time is increased or the number of rewrites is reduced, with the result that the data transfer rate is reduced or the device using the SnTe/Sb$_2$Te$_3$ superlattice is broken or the like.

<Characteristics of Superlattice Phase-Change Memory Cell in First Embodiment>

Therefore, in the superlattice phase-change memory cell of the first embodiment, a multi-level record is realized by using a so-called multi-pulse in which voltage pulses are applied a plurality of times.

Figure 2A:
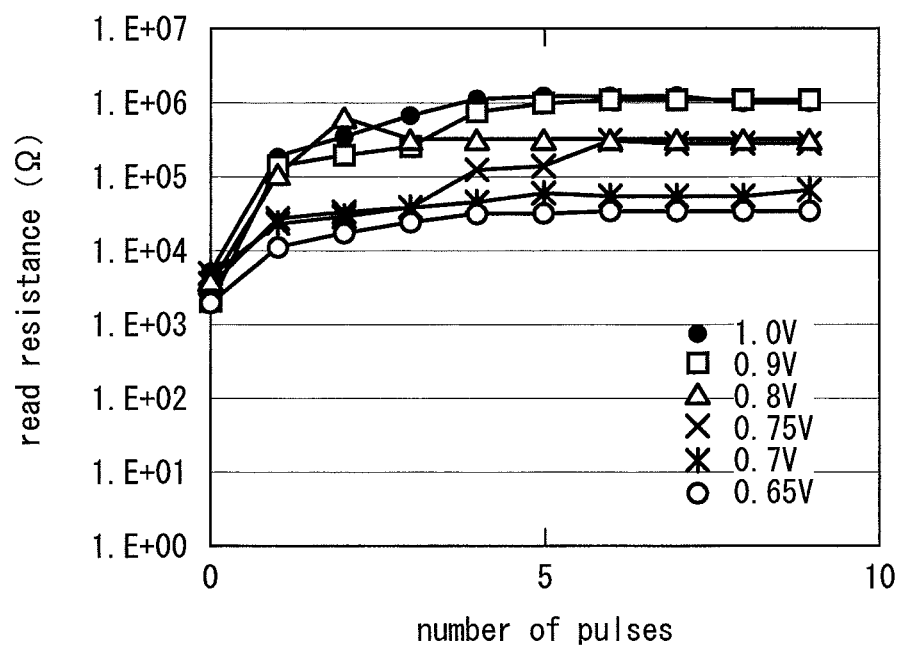
FIG. 2A is a graph showing a relationship between the number of pulse times of voltage pulses and read resistance, with the voltage value of the voltage pulses serving as a parameter, in a device using $Sn_{50}Te_{50}/Sb_2Te_3$ superlattice.
Figure 2B:
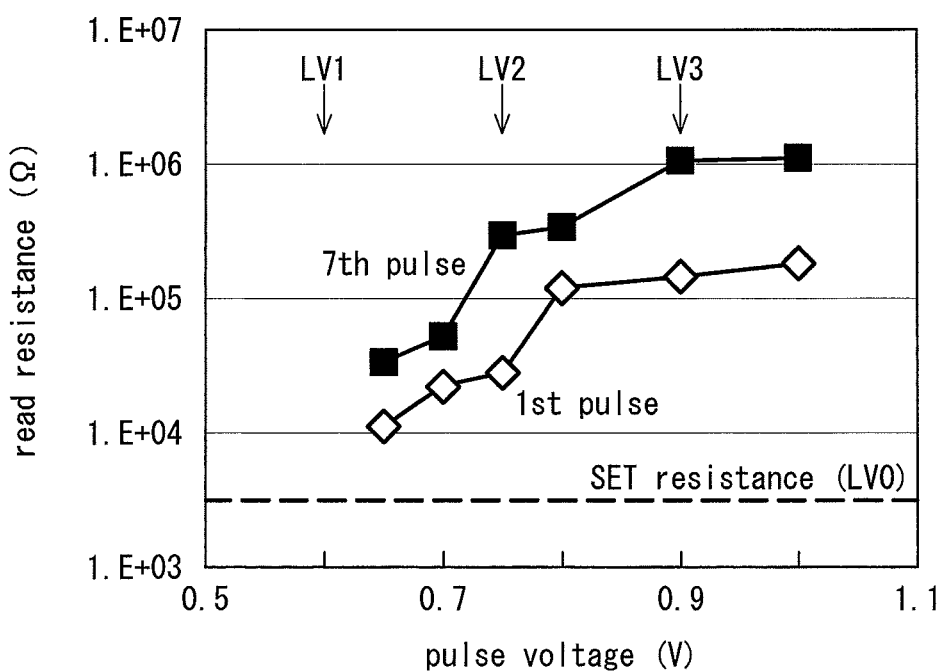
FIG. 2B is a graph showing a relationship between voltage values of voltage pulses and read resistance in the case where the voltage pulse is applied once or seven times in the device using the $Sn_{50}Te_{50}/Sb_2Te_3$ superlattice.

FIG. 2 shows multi-level characteristics of a device using Sn$_{50}$Te$_{50}$/Sb$_2$Te$_3$ superlattice. FIG. 2A is a graph showing a relationship between the number of pulse times of voltage pulses (number of pulses) and read resistance, with the voltage value of the voltage pulses serving as a parameter, and FIG. 2B is a graph showing a relationship between the voltage value of the voltage pulse (pulse voltage) and the read resistance in the case where the voltage pulse is applied once or seven times. In this case, the pulse width of the voltage pulse is set to 100 ns.

As shown in FIG. 2, in the device using the Sn$_{50}$Te$_{50}$/Sb$_2$Te$_3$ superlattice, discontinuous four read resistances appear depending on the voltage value of the voltage pulse.

Figure 3:
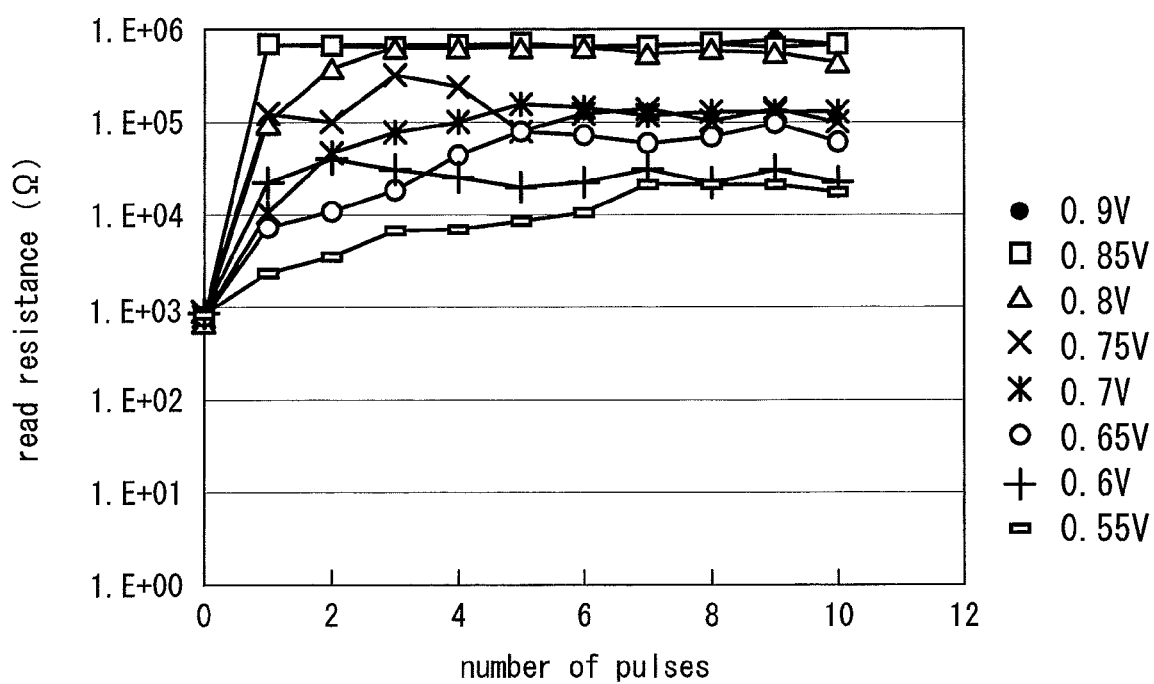
FIG. 3 is a graph showing a relationship between the number of pulse times of voltage pulses and read resistance, with the voltage value of the voltage pulses serving as a parameter, in a device using $Ge_{50}Te_{50}/Sb_2Te_3$ superlattice in the first embodiment.

FIG. 3 shows multi-level characteristics of the device using Ge$_{50}$Te$_{50}$/Sb$_2$Te$_3$ superlattice. FIG. 3 is a graph showing a relationship between the number of pulse times of voltage pulses (number of pulses) and read resistance, with the voltage value of the voltage pulses serving as a parameter. In this case, the pulse width of the voltage pulse is set to 100 ns.

As shown in FIG. 3, also in the device using the Ge$_{50}$Te$_{50}$/Sb$_2$Te$_3$ superlattice, discontinuous four read resistances appear depending on the voltage value of the voltage pulse in the same manner as the device using the Sn$_{50}$Te$_{50}$/Sb$_2$Te$_3$ superlattice.

The multi-level characteristics in which a plurality of discontinuous read resistances which are dependent on the voltage value of the voltage pulse and the number of pulse times appear are characteristics inherent to the superlattice phase-change material.

Next, a mechanism in which a plurality of discontinuous read resistances appear will be described.

For example, as shown in Non-Patent Document 1, a resistance is changed by moving only certain specific atoms among atoms constituting the superlattice phase-change material. The atoms are Ge in the case of the superlattice phase-change material using GeTe, and are Sn in the case of the superlattice phase-change material using SnTe. More specifically, although the superlattice phase-change material is composed of a plurality of layers having different compositions, the superlattice phase-change material that shows the change in resistance among these is mainly GeTe or SnTe.

Figure 4A:
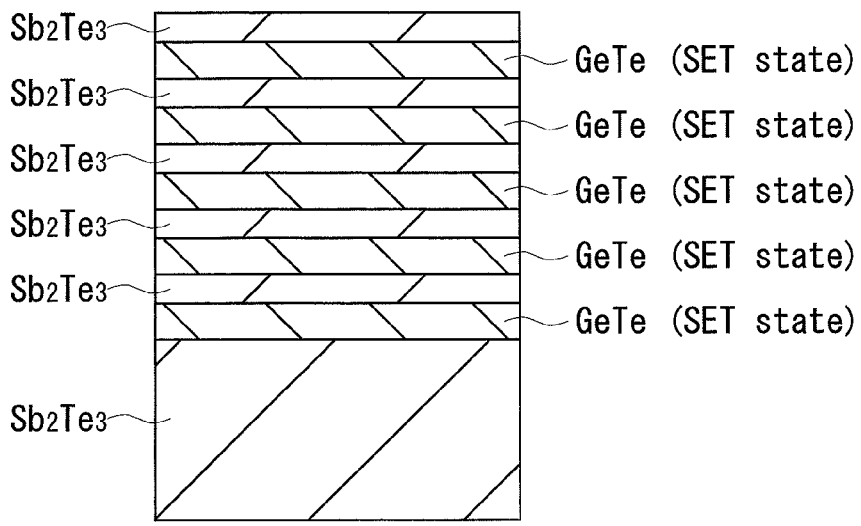
FIG. 4A is a sectional view showing a main part of the $Ge_{50}Te_{50}/Sb_2Te_3$ superlattice in an initial state (SET state) in the first embodiment.
Figure 4B:
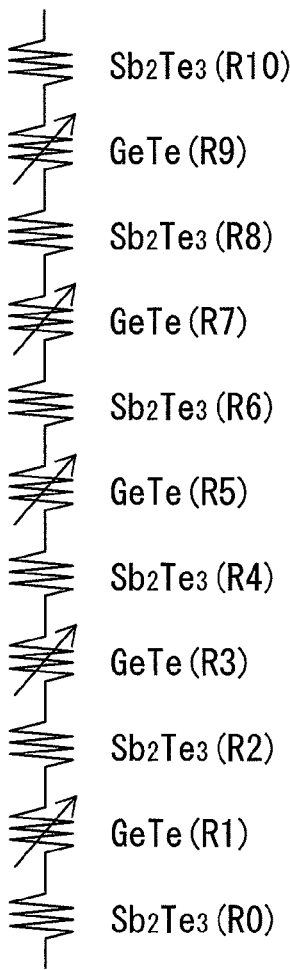
FIG. 4B is an equivalent circuit diagram of the $Ge_{50}Te_{50}/Sb_2Te_3$ superlattice in the initial state (SET state) in the first embodiment.

FIG. 4A is a sectional view showing a main part of the Ge$_{50}$Te$_{50}$/Sb$_2$Te$_3$ superlattice in the initial state (SET state), and FIG. 4B is an equivalent circuit diagram of the Ge$_{50}$Te$_{50}$/Sb$_2$Te$_3$ superlattice in the initial state (SET state).

As shown in FIG. 4A, the initial state of the Ge$_{50}$Te$_{50}$/Sb$_2$Te$_3$ superlattice is a low resistance state (SET state). FIG. 4B shows an equivalent circuit diagram of the Ge$_{50}$Te$_{50}$/Sb$_2$Te$_3$ superlattice in this state. Since the layer which shows a change in resistance is GeTe, the GeTe serves as a variable resistance. When a voltage pulse is applied to electrodes (not shown) formed at both ends of the Ge$_{50}$Te$_{50}$/Sb$_2$Te$_3$ superlattice, the voltage of the voltage pulse is uniformly divided to all the layers.

Here, suppose that the resistance of certain specific GeTe is changed to a resistance that is higher by almost one order of magnitude by applying a multi-pulse with a low voltage. This state will be described with reference to FIG. 5.

Figure 5A:
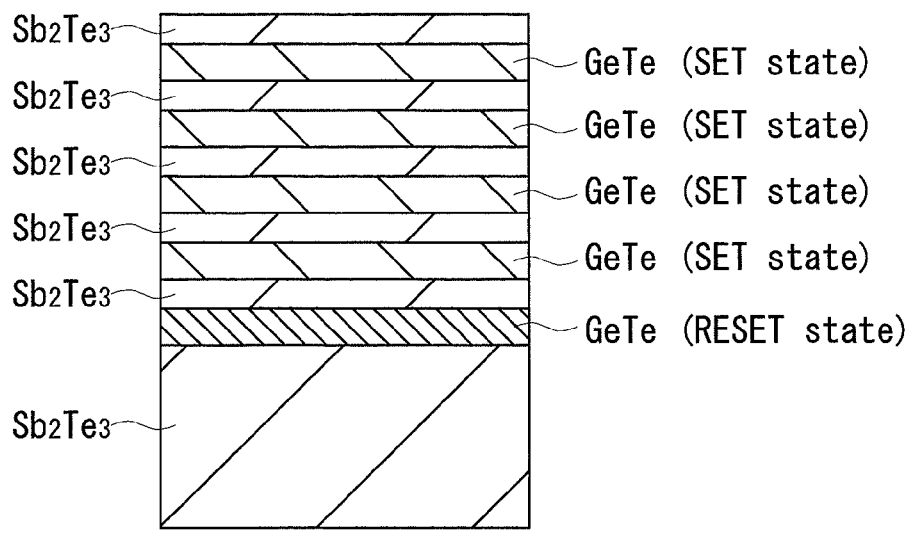
FIG. 5A is a sectional view showing a main part of the $Ge_{50}Te_{50}/Sb_2Te_3$ superlattice when one layer of GeTe is set to a RESET state in the first embodiment.
Figure 5B:
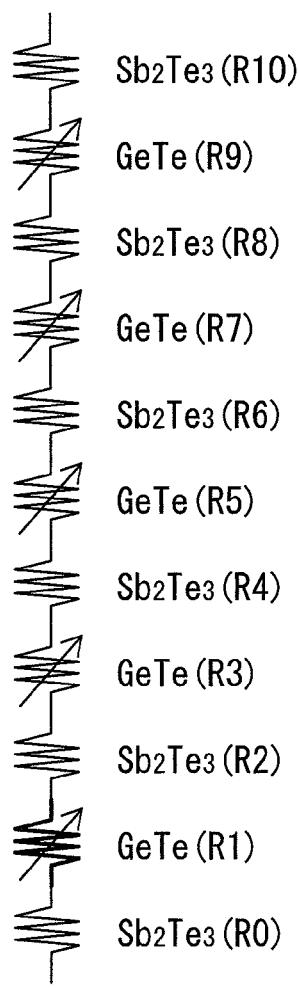
FIG. 5B is an equivalent circuit diagram showing the $Ge_{50}Te_{50}/Sb_2Te_3$ superlattice when one layer of GeTe is set to the RESET state in the first embodiment.

FIG. 5A is a sectional view showing a main part of Ge$_{50}$Te$_{50}$/Sb$_2$Te$_3$ superlattice when one layer of GeTe is set to the RESET state, and FIG. 5B shows an equivalent circuit diagram of the Ge$_{50}$Te$_{50}$/Sb$_2$Te$_3$ superlattice when one layer of GeTe is set to the RESET state. In FIG. 5B, GeTe (R1) corresponds to GeTe changed to have a high resistance.

When a voltage pulse is applied to electrodes (not shown) formed at both ends of the Ge$_{50}$Te$_{50}$/Sb$_2$Te$_3$ superlattice, the voltage is concentrated on the GeTe (R1) changed to have a high resistance, and the voltage applied to the other GeTe is lowered. In order to change the resistance of another GeTe, for example, GeTe (R3), a voltage value higher than the voltage value of the voltage pulse which has changed the resistance of the GeTe (R1) is required. As a result, the read resistance of the Ge$_{50}$Te$_{50}$/Sb$_2$Te$_3$ superlattice is increased.

In the same manner, when the GeTe (R3) is changed to have a high resistance, the voltage is concentrated on the GeTe (R1) and GeTe (R3) changed to have a high resistance, and the voltage to be applied to the other GeTe is lowered. In order to change the resistance of still another GeTe, for example, GeTe (R5), a voltage value higher than the voltage value of the voltage pulse which has changed the resistance of the GeTe (R3) is required. As a result, the read resistance of the Ge$_{50}$Te$_{50}$/Sb$_2$Te$_3$ superlattice is further increased.

It is considered that the reason why the multi-pulse is required is that the voltage value of the voltage pulse is lower than the voltage (RESET voltage) to set the RESET state and thus atoms are moved gradually.

<Specific Configuration of Superlattice Phase-Change Memory Cell and Multi-Level Record in First Embodiment>

Figure 6:
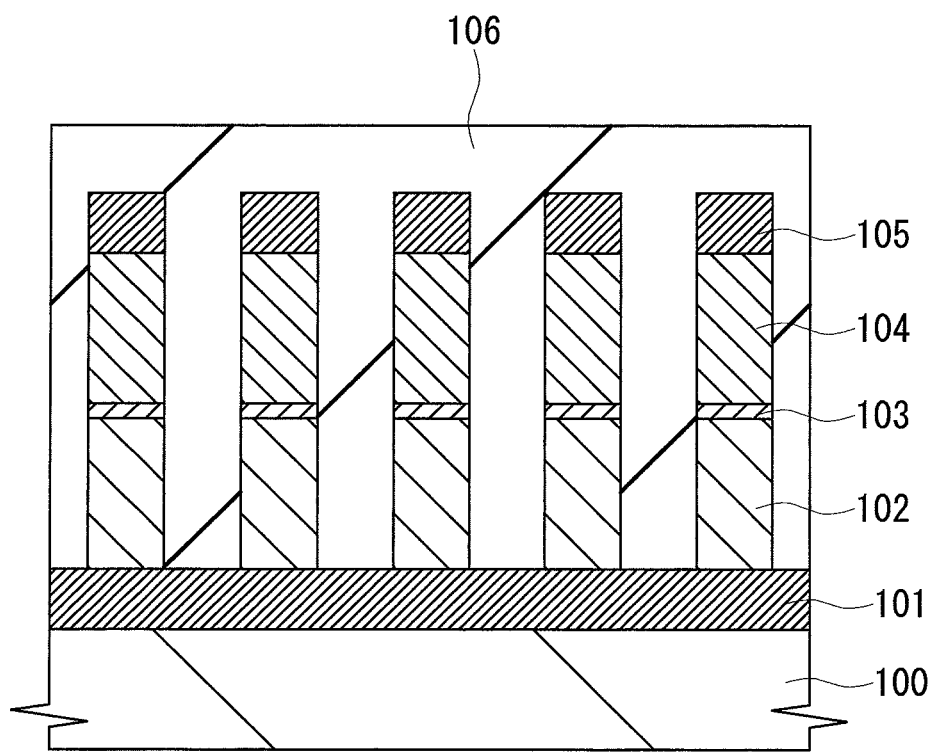
FIG. 6 is a sectional view showing a main part of one example of a configuration of a superlattice phase-change memory cell in the first embodiment.

First, one example of the configuration of a superlattice phase-change memory cell in the first embodiment will be described with reference to FIG. 6. FIG. 6 is a sectional view showing a main part of one example of the configuration of a superlattice phase-change memory cell in the first embodiment.

On a substrate 100, a lower electrode 101 extending in a first direction is formed. The lower electrode 101 is made of, for example, W (tungsten). On the lower electrode 101, a diode 102 serving as a selection element is formed, and one end of the diode 102 is electrically connected to the lower electrode 101.

A recording film 104 is formed at the other end on the side opposite to the one end of the diode 102 via a base film 103. The base film 103 is made of, for example, TiN (titanium nitride), and has a thickness of, for example, 2 nm. The recording film 104 is made of, for example, $Sb_2Te_3$/[GeTe/ $Sb_2Te_3]_8$ and is formed by a sputtering method having a substrate temperature of, for example, 250° C. The thickness of $Sb_2Te_3$ is, for example, 10 nm. The thickness of GeTe constituting [GeTe/$Sb_2Te_3$] is, for example, 1 nm and the thickness of $Sb_2Te_3$ is, for example, 4 nm, and 8 sets of [GeTe/$Sb_2Te_3$] are repeatedly stacked. The base film 103 has a function of reducing the crystal grain size of $Sb_2Te_3$ constituting the recording film 104 to suppress the surface roughness, and thereby forming $Sb_2Te_3$ having a high orientation property.

Moreover, on the recording film 104, an upper electrode 105 which is electrically connected to the recording film 104 and extends in a second direction orthogonal to the first direction is formed. The upper electrode 105 is made of, for example, W (tungsten) and has a thickness of, for example, 50 nm. An interlayer film 106 is formed around the superlattice phase-change memory cell with the configuration described above.

Next, the multi-level record using the superlattice phase-change memory cell will be described with reference to the aforementioned FIG. 2.

Since the resistance of the superlattice phase-change memory cell before the data recording is a high resistance (RESET state), a SET pulse is applied to the superlattice phase-change memory cell. Conditions of this SET pulse, for example, a pulse time and a voltage value can be set as follows. That is, the pulse rising time (tr)/pulse width (tw)/ pulse rising time (if) is set to 100 ns/100 ns/200 ns, and the voltage value is set to 1.0 V. In this case, after applying the SET pulse once, a read-out pulse (with a voltage value of, for example, 0.1 V) is applied to measure a SET resistance, and in the case where the SET resistance is 5 kΩ or more, the SET pulse is applied again.

By using the above-mentioned sequence, all the superlattice phase-change memory cells are set to have a low resistance. The multi-level record is carried out in this state. The multi-level record is carried out by using recording pulses LV1, LV2 and LV3 shown in the aforementioned FIG. 2. The voltage value of the recording pulse LV1 is 0.6 V, the voltage value of the recording pulse LV2 is 0.75 V, and the voltage value of the recording pulse LV3 is 0.9 V. The pulse time is in common with all the pulses, and the pulse rising time (tr)/ pulse width (tw)/pulse rising time (tf) is 5 ns/100 ns/5 ns.

Since the SET pulse to attain the SET state is the recording pulse LV0, the recording pulse LV0 is not applied to the data of the SET pulse. Moreover, in this case, verify to be described later in the second and third embodiments is not carried out.

By setting the number of pulse times of the recording pulses LV1, LV2 and LV3 to be applied to the respective superlattice phase-change memory cells to five times, random data is recorded. The error rate measured without carrying out error corrections is about $2.2 \times 10^{-2}$. In general, the error rate measured without carrying out error corrections is required to be $10^{-3}$ or less, and this requirement is not satisfied in this measurement.

Therefore, by setting the number of pulse times of the recording pulses LV1, LV2 and LV3 to be applied to the respective superlattice phase-change memory cells to seven times, random data is recorded. The error rate measured without carrying out error corrections is about $3.5 \times 10^{-4}$. In this case, the requirement is satisfied.

According to the first embodiment, a SET pulse is once applied to the phase-change memory cell composed of GeTe/ $Sb_2Te_3$ superlattice or SnTe/$Sb_2Te_3$ superlattice to have a SET state (low resistance state). Thereafter, recording pulses LV1, LV2 and LV3 having respectively different voltage values between the voltage value forming the SET state and the voltage value forming the RESET state (high resistance state) are respectively applied to the superlattice phase-change memory cell twice or more. In this manner, a read resistance (SET resistance) corresponding to the recording pulse LV0 (SET pulse) and respective read resistances corresponding to the recording pulses LV1, LV2 and LV3 are obtained, so that the multi-level record can be realized. By realizing the multi-level record in the superlattice phase-change memory cell, it is possible to provide a phase-change device capable of achieving the reduction in power consumption and the capacity increase.

(Second Embodiment)

In the second embodiment, the verify is carried out to the superlattice phase-change memory cell described in the aforementioned first embodiment.

First, the number of pulse times of recording pulses required for a multi-level record will be described.

The number of pulse times of the recording pulses is dependent on the design of the superlattice phase-change memory cell and the stacked structure of the superlattice phase-change material. Therefore, the nominal number of pulse times is preliminarily recorded in a buffer memory in the phase-change device, and after applying the recording pulses until reaching the nominal number of pulse times, the verify is carried out, and the recording is continued until a desired read resistance is obtained.

Alternatively, it is also possible to learn the nominal number of pulse times. Prior to the shipment of the phase-change device or during a period in which data input and output are not executed so frequently in the use of the phase-change device, a test record is carried out so that the nominal number of pulse times of the recording pulses and a nominal voltage value are learned, and the learned values are preliminarily recorded in the buffer memory in the phase-change device. In the case where there are variations in the superlattice phase-change memory cell or in the case of an intended use in which usage environments such as a temperature and the like of the phase-change device fluctuate greatly, this learning method is effective. However, since an enormous buffer memory is required in order to record the learned values of the respective superlattice phase-change memory cells, it is preferable to record learned values relating to a sector or a predetermined memory region.

Next, the method of verify will be described.

For example, the case where the recording pulse LV1 having a voltage value of 0.6 V is applied in an attempt to form a read resistance of the recording pulse LV1 shown in the aforementioned FIG. 2 and the read resistance is then measured, with the result that a read resistance of the recording pulse LV2 is formed will be considered.

Figure 1C:
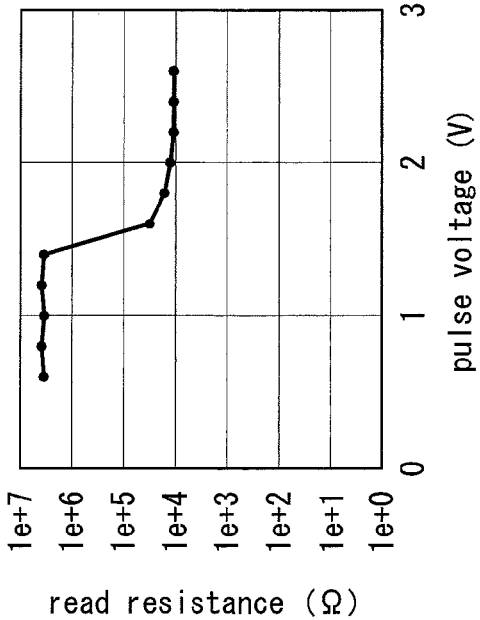
FIG. 1C is a graph showing SET characteristics of a device using $SnTe/Sb_2Te_3$ superlattice.
Figure 1D:
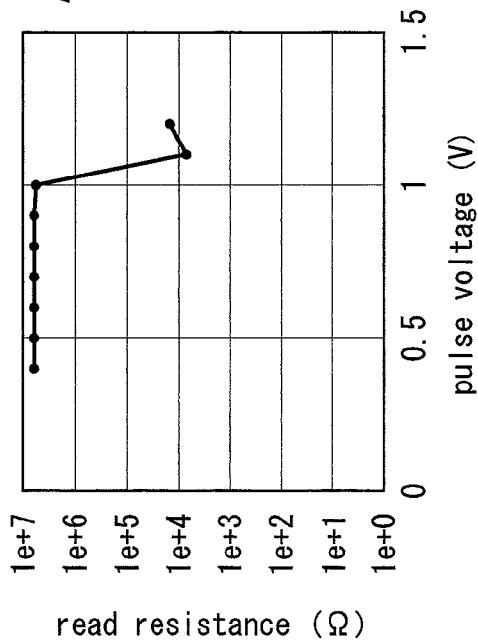
FIG. 1D is a graph showing RESET characteristics of the device using $SnTe/Sb_2Te_3$ superlattice.

As shown in the aforementioned FIG. 1C, since the SET operation occurs abruptly, it is difficult to form the read resistance of the recording pulse LV1 by applying the recording pulse LV1 having a predetermined voltage value only once. Therefore, in this case, it is desirable that the SET pulse is once applied to form the SET resistance and the recording pulse LV1 of less than 0.6 V, for example, 0.55 V is then applied a plurality of times, and thereby forming a read resistance of the recording pulse LV1.

Next, a specific example of performing the verify will be described.

The configuration of the superlattice phase-change memory cell is the same as that of the superlattice phase-change memory cell described in the aforementioned first embodiment. Moreover, the pulse conditions are the same as those described in the aforementioned first embodiment. The nominal number of pulse times is set to seven times.

Different from the aforementioned first embodiment, in the case where the read resistance of the superlattice phase-change memory cell is measured after record has been carried out on the superlattice phase-change memory cell, with the result that the read resistance is not within a range of desired read resistance, the record is carried out again. The range of desired read resistance is, for example, from 7 kΩ to 30 kΩ in the recording pulse LV1, from 70 kΩ to 300 kΩ in the recording pulse LV2, and to 700 kΩ or more in the recording pulse LV3. However, when the read resistance becomes 10 MΩ or more in all the superlattice phase-change memory cells, it is determined that the superlattice phase-change memory cells are broken, and the corresponding superlattice phase-change memory cells are recorded in the buffer memory in the phase-change device so as not to be used thereafter.

In this case, when the record is carried out again because the read resistance is not the nominal read resistance, the SET pulse is once applied to form the SET resistance, and the recording pulses LV1, LV2 and LV3 are again applied seven times.

As a result, the error rate measured without carrying out error corrections is about $4.8 \times 10^{-5}$, and the requirement is satisfied. Also, a period of time required for completing the record in all the superlattice phase-change memory cells becomes 2.2 times longer than that of the aforementioned first embodiment without carrying out the verify.

Moreover, the pulse rising time (tr)/pulse width (tw)/pulse rising time (tf) of the recording pulses LV1, LV2 and LV3 is set to 5 ns/20 ns/5 ns, and the similar results can be obtained.

According to the second embodiment, by carrying out the verify, the error rate can be reduced in comparison with that of the first embodiment.

(Third Embodiment)

Figure 7:
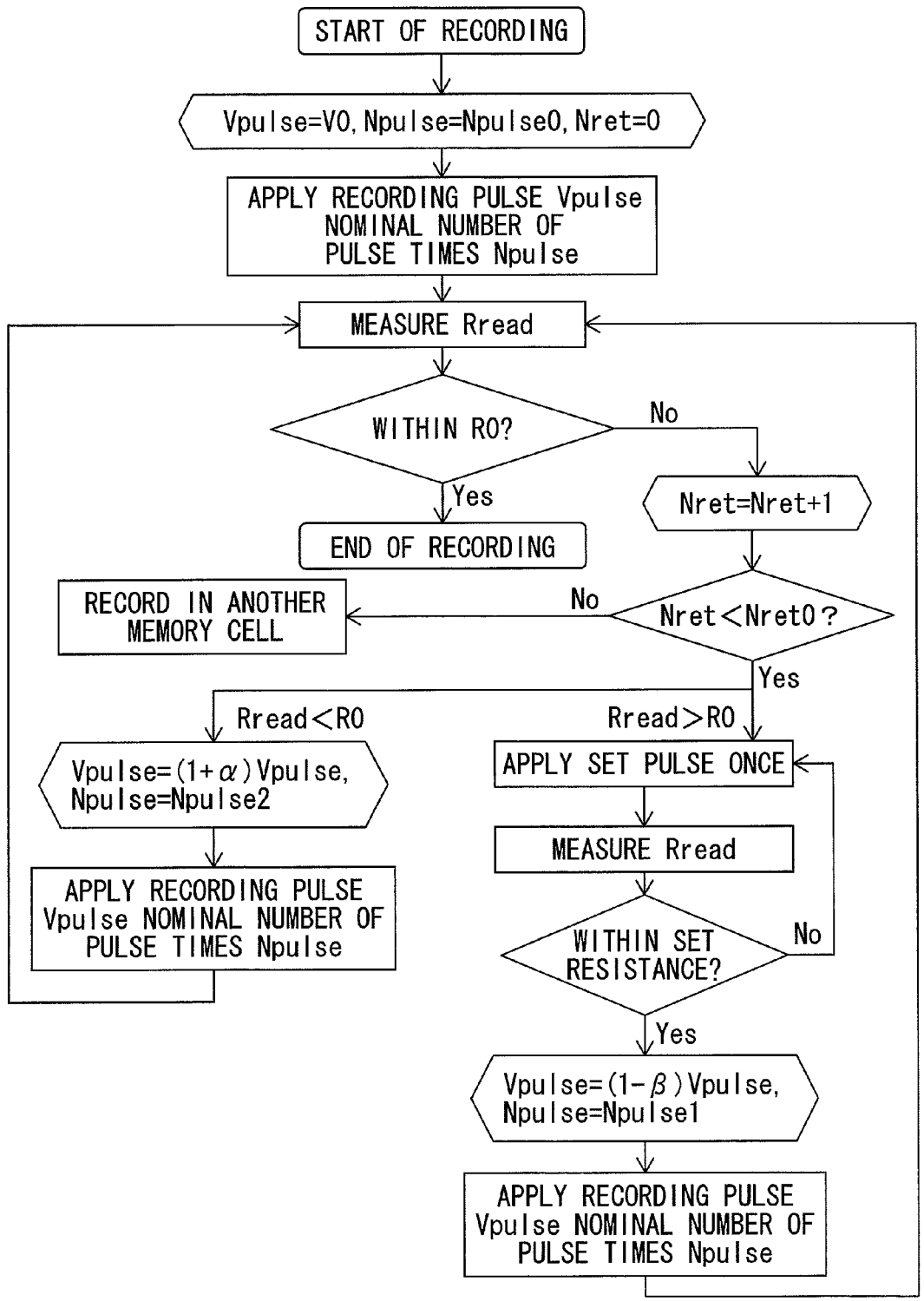
FIG. 7 is a drawing showing one example of an algorithm in the case of carrying out the verify in the third embodiment.

In the third embodiment, the method of verify different from the method of verify described in the aforementioned second embodiment will be described. FIG. 7 is a drawing showing an algorithm in the case of carrying out the verify in the third embodiment. In the following description, a nominal read resistance is referred to as "nominal resistance", a voltage value of a recording pulse required for recording a certain nominal resistance in a superlattice phase-change memory cell is referred to as "nominal voltage", and the nominal number of times of pulses is referred to as "the nominal number of pulse times".

First, the nominal voltage Vpulse is set to V0 and the nominal number of pulse times Npulse is set to Npulse0. Next, the recording pulse of the nominal voltage Vpulse is applied the nominal number of pulse times Npulse, and a read resistance Rread thus formed is measured. Here, in the case where the read resistance Rread is within the range of the desired nominal resistance R0, the record is completed. In the case where the read resistance Rread is higher than or lower than the desired nominal resistance R0, the following verify is further carried out.

(1) Case where the Read Resistance Rread is Higher than the Desired Nominal Resistance R0

In order to set the superlattice phase-change memory cell to the SET state, the SET pulse is applied once, and the read resistance Rread is measured. In the case where the read resistance Rread is not within the range of the desired SET resistance, the SET pulse is applied one more time.

In the case where the read resistance Rread is within the range of the desired SET resistance, in order to make the nominal voltage Vpulse lower, the nominal voltage Vpulse is newly set to $(1-\beta)$Vpulse. In this case, $\beta > 0$ is satisfied. Moreover, the nominal number of pulse times Npulse is newly set to Npulse1. This new nominal voltage $(1-\beta)$Vpulse is applied the new nominal number of pulse times Npulse1, and the read resistance Rread thus formed is measured.

(2) Case where the Read Resistance Rread is Lower than the Desired Nominal Resistance R0

An additional nominal voltage Vpulse is applied. In this case, the nominal voltage Vpulse is newly set to $(1+\alpha)$Vpulse. In this case, $\alpha > 0$ is satisfied. Moreover, the nominal number of pulse times Npulse is newly set to Npulse2. This new nominal voltage $(1+\alpha)$Vpulse is applied the new nominal number of pulse times Npulse2, and the read resistance Rread thus formed is measured.

Moreover, the upper limit number of verify times Nret0 is preliminarily defined. In the case where the desired nominal resistance R0 cannot be formed even when the verify is carried out up to the upper limit number of verify times Nre0, it is determined that the superlattice phase-change memory cell is broken, and the registration to prohibit the use of the corresponding superlattice phase-change memory cell is recorded in the buffer memory in the phase-change device. After that, the corresponding data is recorded in another superlattice phase-change memory cell.

Next, the results of carrying out the verify using the above-mentioned algorithm to a phase-change device having superlattice phase-change memory cells using GeTe and a phase-change device having superlattice phase-change memory cells using SnTe will be described.

Parameter values are set to, for example, the nominal number of pulse times Npulse0=5, the nominal number of pulse times Npulse1=5, the nominal number of pulse times Npulse2=3, the number of verify times Nret0=20, $\alpha=0.05$ and $\beta=0.05$. For example, in the same manner as the case of the aforementioned first embodiment, the nominal voltage V0 is set to 0.6 V for the recording pulse LV1, 0.75 V for the recording pulse LV2, and 0.9 V for the recording pulse LV3. Moreover, in the same manner as the case of the aforementioned second embodiment, the nominal resistance R0 is 5 kΩ or less for the recording pulse LV0 (SET pulse), 7 kΩ to 30 kΩ for the recording pulse LV1, 70 kΩ to 300 kΩ for the recording pulse LV2, and 700 kΩ or more for the recording pulse LV3.

As a result, with respect to the measured error rates, the error rate of the phase-change device having superlattice phase-change memory cells using GeTe becomes about $5.3 \times 10^{-6}$, and the error rate of the phase-change device having superlattice phase-change memory cells using SnTe becomes about $6.1 \times 10^{-6}$.

According to the third embodiment, by altering the conditions of recording pulses at the time of carrying out the verify, the error rate can be reduced in comparison with those of the first and second embodiments.

(Fourth Embodiment)

The fourth embodiment is characterized by a method of setting pulse conditions in the phase-change device in addition to the verify using the algorithm described in the aforementioned third embodiment.

For example, in a phase-change device having 1 G (giga) bits, the data region is divided into sectors each having 4 k (kilo) bits. Further, prior to the use of the phase-change device, specified pulse conditions are set for each of the sectors.

First, specified pulse conditions for the respective sectors are recorded in the buffer memory in the phase-change device. At this time, the specified pulse conditions for the respective sectors are recorded by, for example, the algorithm described in the aforementioned third embodiment. The specified pulse conditions include, for example, the nominal voltage, the nominal number of pulse times, and the nominal resistance. For example, in the same manner as the aforementioned first embodiment, the nominal voltage V0 is set to 0.6 V for the recording pulse LV1, 0.75 V for the recording pulse LV2, and 0.9 V for the recording pulse LV3. Moreover, for example, in the same manner as the aforementioned second embodiment, the nominal resistance R0 is set to 5 kΩ or less for the recording pulse LV0 (SET pulse), 7 kΩ to 30 kΩ for the recording pulse LV1, 70 kΩ to 300 kΩ for the recording pulse LV2, and 700 kΩ or more for the recording pulse LV3.

In the case of recording data in the superlattice phase-change memory cell, the specified pulse conditions relating to a sector to which the corresponding superlattice phase-change memory cell belongs are obtained from the buffer memory, and the specified pulse conditions are used.

By setting specified pulse conditions for each of the sectors in the above-described manner, it becomes possible to shorten the recording time. For example, the recording time in the fourth embodiment becomes about 73% of the recording time of the aforementioned third embodiment. Moreover, the error rate becomes about $8.8 \times 10^{-7}$.

According to the fourth embodiment, by dividing the data region into a plurality of sectors and setting specified pulse conditions for each of the sectors, the recording time can be shortened, and the error rate can also be reduced in comparison with the aforementioned first to third embodiments.

In the foregoing, the invention made by the inventors of the present invention has been concretely described based on the embodiments. However, it is needless to say that the present invention is not limited to the foregoing embodiments and various modifications and alterations can be made within the scope of the present invention.

In the above-mentioned embodiments, for example, the recording film is composed of two kinds of layers having mutually different compositions. However, the present invention is not limited to this configuration, and the recording film may be composed of three or more kinds of layers having mutually different compositions.

What is claimed is:

1. A phase-change device comprising:
a memory cell for recording data by utilizing a difference in electric resistance caused by atomic arrangement of a recording film,
wherein the recording film is a stacked film in which two or more kinds of layers having mutually different compositions are alternately stacked repeatedly,
wherein the two or more kinds of layers respectively contain Te,
wherein the recording film is formed with a lowest resistance by applying a recording pulse having a first voltage value; and
wherein, after the recording film having the lowest resistance is formed by applying the recording pulse having the first voltage value, a recording pulse having a third voltage value between the first voltage value forming the lowest resistance of the recording film and a second voltage value forming a highest resistance of the recording film is applied to the memory cell at least twice to form a resistance between the lowest resistance and the highest resistance in the recording film.

2. The phase-change device according to claim 1, wherein one layer of the two or more kinds of layers contains $Sb_2Te_3$, and another one layer contains GeTe or SnTe.

3. The phase-change device according to claim 1, wherein the third voltage value and the number of pulse times of the recording pulse are preliminarily set, and
wherein in the case where the resistance formed by applying the recording pulse to the memory cell deviates from a permissible value, after the first voltage value forming the lowest resistance is applied to the memory cell, the third voltage value, the number of pulse times, or the third voltage value and the number of pulse times of the recording pulse are altered.

4. The phase-change device according to claim 1, wherein the third voltage value and the number of pulse times of the recording pulse are preliminarily set, and
wherein in the case where the resistance formed by applying the recording pulse to the memory cell is higher than a permissible value, after the first voltage value forming the lowest resistance is applied to the memory cell, the recording pulse having a fourth voltage value that is set lower than the third voltage value is applied.

5. The phase-change device according to claim 1, wherein the third voltage value and the number of pulse times of the recording pulse are preliminarily set, and
wherein in the case where the resistance formed by applying the recording pulse to the memory cell is lower than a permissible value, after the first voltage value forming the lowest resistance is applied to the memory cell, the recording pulse having a fifth voltage value that is set higher than the third voltage value is applied.

* * * * *